United States Patent
Wu et al.

(10) Patent No.: US 12,024,591 B2
(45) Date of Patent: Jul. 2, 2024

(54) MODIFICATION METHOD OF POLYPHENYLENE ETHER RESIN, LAMINATED FILM COMPOSITE, LAMINATED FILM, AND SUBSTRATE

(71) Applicant: Wuhan Choice Technology Co, Ltd, Wuhan (CN)

(72) Inventors: De Wu, Wuhan (CN); Yi Wang, Wuhan (CN); Shuhang Liao, Wuhan (CN); Junxing Su, Wuhan (CN)

(73) Assignee: Wuhan Choice Technology Co, Ltd, Wuhan (CN)

( * ) Notice: Subject to any disclaimer, the term of this patent is extended or adjusted under 35 U.S.C. 154(b) by 0 days.

(21) Appl. No.: 18/459,383

(22) Filed: Aug. 31, 2023

(65) Prior Publication Data

US 2024/0052098 A1   Feb. 15, 2024

Related U.S. Application Data

(63) Continuation of application No. PCT/CN2023/087230, filed on Apr. 10, 2023.

(30) Foreign Application Priority Data

Aug. 4, 2022 (CN) .......................... 202210930127.8

(51) Int. Cl.
| | |
|---|---|
| C08F 212/08 | (2006.01) |
| C08F 232/08 | (2006.01) |
| C08G 65/48 | (2006.01) |
| C08G 81/02 | (2006.01) |
| C08J 5/18 | (2006.01) |
| C08K 7/18 | (2006.01) |
| C08L 71/12 | (2006.01) |

(52) U.S. Cl.
CPC ............. *C08G 65/485* (2013.01); *C08J 5/18* (2013.01); *C08K 7/18* (2013.01); *C08L 71/126* (2013.01); *C08F 212/08* (2013.01); *C08F 232/08* (2013.01); *C08G 81/025* (2013.01); *C08G 2261/126* (2013.01); *C08J 2353/00* (2013.01); *C08J 2371/12* (2013.01); *C08L 2203/16* (2013.01)

(58) Field of Classification Search
None
See application file for complete search history.

(56) References Cited

FOREIGN PATENT DOCUMENTS

| | | |
|---|---|---|
| CN | 111315820 A | 6/2020 |
| CN | 113897163 A | 1/2022 |
| JP | 2018168217 A | 11/2018 |

*Primary Examiner* — Richard A Huhn
(74) *Attorney, Agent, or Firm* — Nitin Kaushik

(57) ABSTRACT

The present disclosure provides a method for modifying a polyphenylene ether resin, a laminated film composite, a laminated film, and a substrate. The method for modifying a polyphenylene ether resin using an indene oligomer to reduce the molecular weight of the polyphenylene ether to obtain an indene oligomer-modified polyphenylene ether resin. The modified polyphenylene ether with a smaller molecular weight has a lower softening point and melting point, a better interfacial adhesion, and can be better adhered to a substrate of an integrated circuit. Meanwhile, because it has a lower dielectric constant and dielectric loss, the dielectric constant and dielectric loss of the substrate can be reduced, thereby solving the technical problem of electric leakage and heat generation caused when the existing polyphenylene ether resin is applied to an integrated circuit when the feature size of the integrated circuit is reduced.

7 Claims, 2 Drawing Sheets

--- mixing an indene oligomer, a polyphenylene ether and a benzene-based organic solvent and then heating and dissolving same to obtain a mixed solution — S11 adding a peroxide initiator to the mixed solution and insulating, and then lowering to room temperature — S12

MODIFICATION METHOD OF POLYPHENYLENE ETHER RESIN, LAMINATED FILM COMPOSITE, LAMINATED FILM, AND SUBSTRATE

CROSS-REFERENCE TO RELATED APPLICATIONS

The present disclosure claims priority to Chinese Patent Application No. 2022109301278, filed on Aug. 4, 2022, entitled "Modification method of polyphenylene ether resin, laminated film composite, laminated film, and substrate", the entire contents of which are incorporated herein by reference.

TECHNICAL FIELD

This disclosure relates to the field of integrated circuit technology, in particular to a modification method of polyphenylene ether resin, laminated film composite, laminated film, and substrate.

BACKGROUND

In the field of integrated circuits, feature size refers to the smallest dimension in a semiconductor device. In general, the smaller the feature size, the higher the chip integration, the better the performance, and the lower the power consumption. However, as the feature size of the integrated circuit decreases, the parasitic resistance and capacitance of the interconnections cause signal delay, crosstalk, and increased power consumption, resulting in increased leakage current of the integrated circuit, increased capacitive effect between the conductors and increased heating of the integrated circuit. Improving circuit design cannot fully meet the application requirements of high-speed signal transmission and complete signal at high frequencies, so reducing dielectric constant and dielectric loss has become a hot pursuit for substrate manufacturers. The integrated circuit packaging substrate is a bridge connecting chip manufacturing and electronic products of the entire machine. One side is connected to the chip and the other side is connected to the PCB board, achieving optimized output of chip functions. Polyphenylene ether has a large molecular weight, poor solubility at room temperature, and poor compatibility with other resins such as epoxy resin, which has negative effects on mechanical properties, heat resistance, and dielectric properties of the composite.

SUMMARY

By utilizing one or more embodiments of the present disclosure, a modification method of a polyphenylene ether resin, a laminated film composite, a laminated film, and a substrate are provided to solve the prior art technical problems of electrical leakage and heat generation caused when a polyphenylene ether resin is applied to an integrated circuit with a reduced feature size of the integrated circuit.

In a first aspect of the present disclosure, provided is a method for modifying a polyphenylene ether resin, including: mixing an indene oligomer, a polyphenylene ether, and a benzene-based organic solvent and then heating and dissolving the same to obtain a mixed solution; and adding a peroxide initiator to the mixed solution and insulating to obtain an indene oligomer-modified polyphenylene ether resin so as to reduce the molecular weight of the polyphenylene ether; wherein the indene oligomer has a structural formula of

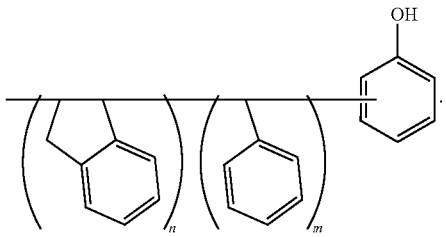

In a second aspect of the present disclosure, provided is a laminated film composite including the indene oligomer-modified polyphenylene ether resin obtained by the method for modifying the polyphenylene ether resin of the first aspect.

In a third aspect of the present disclosure, provided is a laminated film formed from the laminated film composite of the second aspect.

In a fourth aspect of the present disclosure, provided is a substrate comprising a substrate body, and the laminated film of the third aspect attached to at least part of the surface of the substrate body.

In a fifth aspect of the present disclosure, provided is a surface treatment method of a substrate, including: laminating the laminated film of the third aspect to at least part of the surface of the substrate, and performing vacuum hot pressing and curing to obtain the laminated film; opening pores on the laminated film, plating copper, and routing. The process parameters for the vacuum hot pressing include a temperature of 80-100° C. and a vacuum time of 50 s-70 s. The process parameters for the curing operation process include a curing temperature of 170-190° C. and a curing time of 1.8 h-2.2 h.

BRIEF DESCRIPTION OF DRAWINGS

In order to more clearly illustrate the technical solutions of the embodiments of the present disclosure, a brief description will be given below of the accompanying drawings which are required to be used in the description of the embodiments. It is obvious that the drawings in the description below are only some embodiments of the present disclosure, and it would be obvious for a person skilled in the art to obtain other drawings according to these drawings without involving any inventive effort.

DETAILED DESCRIPTION OF THE EMBODIMENTS

Figure 1:
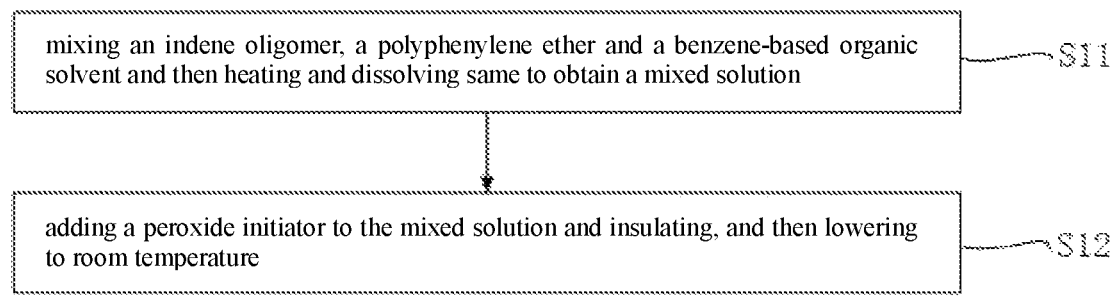
FIG. 1 shows a schematic flow diagram of a method for modifying a polyphenylene ether resin according to some embodiments of the present disclosure.

In order to make the purpose, technical solution, and advantages of the disclosed embodiments clearer, the following will provide a clear and complete description of the technical solution in combination with the accompanying drawings in the disclosed embodiments. Obviously, the described examples are a part of the disclosed examples, not all of them. Based on the embodiments of the present disclosure, all Other embodiments obtained by a person of ordinary skill in the art without inventive effort fall within the scope of the present disclosure.

The various examples of the present disclosure may exist in one range; it should be understood that the description in range format is merely for convenience and brevity and should not be construed as an inflexible limitation on the scope of the present disclosure. Accordingly, the description of a range should be considered to have specifically disclosed all the possible subranges as well as individual numerical values within that range. For example, it should be considered that the range description from 1 to 6 has specifically disclosed subranges, such as from 1 to 3, from 1 to 4, from 1 to 5, from 2 to 4, from 2 to 6, from 3 to 6, and a single number within the range, such as 1, 2, 3, 4, 5, and 6, regardless of the range. Further, whenever a numerical range is indicated in this disclosure, it is meant to include any cited number (fractional or integral) within the indicated range. Unless otherwise specifically noted, the various starting materials, reagents, instruments, equipment, and the like used in the present disclosure are either commercially available or may be prepared by known methods.

In the present disclosure, the use of directional words such as "upper" and "lower" when not stated to the contrary, specifically refers to the direction of the drawing in the figures. In addition, in the description of the specification of the present disclosure, the terms "including", "comprising" and the like mean "including, but not limited to". In this disclosure, relational terms such as "first" and "second", and the like, are used solely to distinguish one entity or operation from another entity or operation without necessarily requiring or implying any actual relationship or order between such entities or operations. In this disclosure, "and/or", describing an associated relationship of an associated object, means that three relationships may exist, for example, A and/or B, may mean: A is present alone, A and B are present together, and B is present alone. Wherein A and B may be singular or plural. In the present disclosure, "at least one" means one or more, and "plurality" means two or more. "At least one", "at least one of", or the like, refers to any combination of these items, including single items or any combination of plural items. For example, "at least one of a, b, or c", or, "at least one of a, b, and c", each may represent: a, b, c, a-b (i.e. a and b), a-c, b-c, or a-b-c, wherein a, b, and c, respectively, may be single or multiple.

In a first aspect, as shown in FIG. 1, the present disclosure provides a method of modifying a polyphenylene ether resin, comprising: S11, mixing an indene oligomer, a polyphenylene ether, and a benzene-based organic solvent and then heating and dissolving the same to obtain a mixed solution; and S12 adding a peroxide initiator to the mixed solution and insulating to obtain an indene oligomer-modified polyphenylene ether resin so as to reduce the molecular weight of the polyphenylene ether; wherein the indene oligomer has a structural formula of

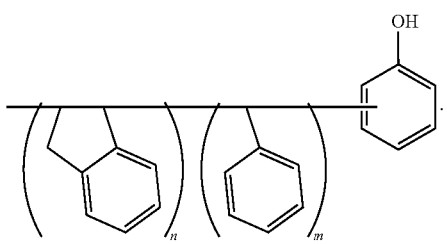

The method modifies the polyphenylene ether with an indene oligomer to reduce the molecular weight of the polyphenylene ether to obtain an indene oligomer-modified polyphenylene ether resin. The modified polyphenylene ether with a smaller molecular weight has a lower softening point and melting point has a better interfacial adhesion, and can be better laminated to a substrate of an integrated circuit. At the same time, because it has a lower dielectric constant and dielectric loss, the dielectric constant and dielectric loss of the substrate can be reduced, thereby solving the technical problem of electric leakage and heat generation caused when the existing polyphenylene ether resin is applied to an integrated circuit when the feature size of the integrated circuit is reduced. The molecular structure diagram of the indene oligomer used is shown above and can be purchased from Nippon Steel Corporation, model: IP-100. Polyphenylene ethers have low dielectric constants and dielectric losses, but are relatively poor in temperature resistance, processability, and interfacial adhesion, lowering the molecular weight of polyphenylene ethers by indene oligomers, improving the processability of polyphenylene ethers, and increasing the interfacial adhesion of materials without affecting the dielectric constants and dielectric losses.

In some embodiments, the process parameters for heating include a temperature of 90° C.-110° C.; the process parameters for insulating include an insulation duration of 4 h-8 h.

In some embodiments, the weight ratio of the indene oligomer to the polyphenylene ether is 5-15: 90-110.

By controlling the weight ratio of the indene oligomer to the polyphenylene ether, the molecular weight of the product is moderate, and when applied to the laminated film, the laminated film has low dielectric constant, low dielectric loss value, and good properties.

In a second aspect, the present disclosure provides a laminated film composite comprising an indene oligomer-modified polyphenylene ether resin obtained by the method for modifying the polyphenylene ether resin of the first aspect.

The indene oligomer-modified polyphenylene ether resin contained in the laminated film composite is obtained by the above-mentioned modification method of the polyphenylene ether resin. Since the laminated film composite adopts some or all of the technical solutions of the above-mentioned embodiments, it has at least all the beneficial effects brought by the technical solutions of the above-mentioned embodiments, and will not be described in detail here. Polyphenylene ether resin modified by indene oligomer has a lower dielectric constant and dielectric loss. As a filler, spherical silica has a low dielectric constant and low dielectric loss, which can reduce the thermal expansion coefficient of the laminated film. The main chain structure of liquid rubber-modified epoxy resin is polybutadiene, which has good dielectric properties and is conducive to film formation. Reactive ester curing agents can react with hydroxyl groups in the system, reduce polar groups, lower dielectric constant, and dielectric loss. The silane coupling agent facilitates the compatibility of silica with an epoxy resin system. The curing accelerator may promote the completion of the curing reaction. The laminated film has good flowability and can fill voids and surface gaps in the substrate; having a lower dielectric constant and dielectric loss can reduce the leakage current of integrated circuits, reduce the capacitance effect between wires, and reduce the heating of integrated circuits.

In some embodiments, the laminated film composite further includes spherical silica, a liquid rubber-modified epoxy resin, an active ester curing agent, a silane coupling agent, and a curing accelerator.

Liquid rubber-modified epoxy resin can be purchased from Loho High-tech Materials (Shanghai) Co. Ltd. model: EPP-175. Liquid rubber-modified epoxy resin is a high-purity flexible epoxy resin formed by grafting low-viscosity liquid polybutadiene rubber onto a bisphenol A epoxy resin molecular chain.

In some embodiments, the weight ratio of the indene oligomer-modified polyphenylene ether resin, the spherical silica, the liquid rubber-modified epoxy resin, the active ester curing agent, the silane coupling agent, and the curing accelerator is 50-70: 140-18:10-20: 20-40:0.1-5: 1-5.

By controlling the ratio of raw materials, the laminated film has a lower dielectric constant and dielectric loss, better temperature resistance, processability, and interfacial adhesion. A laminated film composite can generally be prepared by a process comprising: indene oligomer-modified polyphenylene ether resin, spherical silica, liquid rubber-modified epoxy resin, active ester curing agent, silane coupling agent, and curing accelerator to obtain a laminated film composite. The laminated film composite is simple to prepare.

In a third aspect, the present disclosure provides a laminated film formed from the laminated film composite of any one of claims 4-6.

The laminated film is formed from the above-mentioned laminated film composite.

The indene oligomer-modified polyphenylene ether resin contained in the laminated film composite is obtained by the above-mentioned modification method of the polyphenylene ether resin. Since the laminated film adopts some or all of the technical solutions of the above-mentioned embodiments, it has at least all the beneficial effects brought by the technical solutions of the above-mentioned embodiments, and will not be described in detail here. The laminated film can be prepared by coating the laminated film composite on the PET base film and drying.

In a fourth aspect, the present disclosure provides a substrate comprising: a substrate body, and the laminated film of claim 7 attached to at least a part of the surface of the substrate body.

The substrate comprises a laminated film. The laminated film is formed from the above-mentioned laminated film composite. The indene oligomer-modified polyphenylene ether resin contained in the laminated film composite is obtained by the above-mentioned modification method of the polyphenylene ether resin. Since the laminated film adopts some or all of the technical solutions of the above-mentioned embodiments, it has at least all the beneficial effects brought by the technical solutions of the above-mentioned embodiments, and will not be described in detail here. Attaching a laminated film on the surface of the substrate results in a lower dielectric constant and dielectric loss. When preparing high-density integrated circuits, it is beneficial to reduce the leakage current of the integrated circuit, reduce the capacitance effect between wires, and reduce the heating of the integrated circuit.

Figure 2:
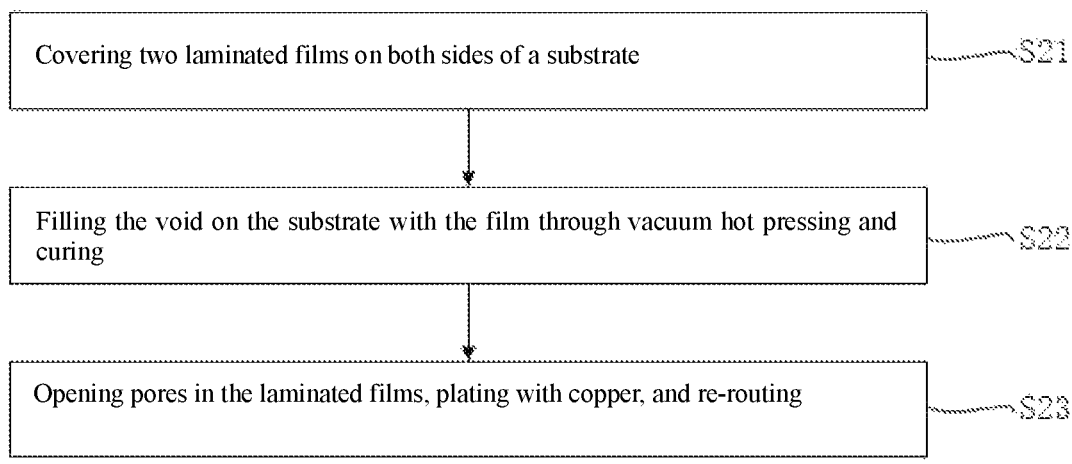
FIG. 2 shows a schematic flow diagram of a substrate surface treatment method according to some embodiments of the present disclosure.

In a fifth aspect, as shown in FIG. 2, the present disclosure provides a surface treatment method of a substrate, comprising: laminating the laminated film of claim 7 to at least part of the surface of the substrate S21; S22, performing vacuum hot pressing and curing after lamination to obtain a laminated film; S23, opening pores on the laminated film, plating copper and routing; the process parameters for the vacuum hot pressing include a temperature of 80° C.-100° C. and a vacuum time of 50 s-70 s; the process parameters for the curing operation include a curing temperature of 170° C.-190° C. and a curing time of 1.8 h-2.2 h.

After the laminated film is laminated on the substrate, the film material is allowed to fill voids on the substrate, then the laminated film is subjected to pore opening, copper plating, and routing. Wiring is formed through various processes so that a high-density integrated circuit can be prepared.

This disclosure is further illustrated by the following specific examples. It should be understood that the examples are only used to illustrate this disclosure and not to limit the scope of this disclosure. Experimental methods for which specific conditions are not specified in the following examples are generally determined according to national standards. If there is no corresponding national standard, the test is conducted according to the general international standard, conventional conditions, or the conditions recommended by the manufacturer.

Example 1: a substrate and a surface treatment method thereof, comprising the steps of: (1) selection of raw materials: 50 parts of an indene oligomer-modified polyphenylene ether resin, 180 parts of a spherical silica, 15 parts of a liquid rubber-modified epoxy resin (EPP 175), 35 parts of an active ester curing agent (HPC~8000~65T), 1 part of a silane coupling agent (KBM~403), and 2 parts of a curing accelerator (2E~4MI); (2) preparation of laminated film: the indene oligomer-modified polyphenylene ether resin, spherical silica, liquid rubber-modified epoxy resin, active ester curing agent, silane coupling agent, and curing accelerator were mixed to obtain a laminated film composite; the laminated film composite was applied on a PET base film and dried at 110° C. for 7 min; (3) substrate surface treatment: the laminated film was laminated on the substrate surface, subjected to vacuum hot-pressing at 90° C. for 60 s after the lamination, and then cured at 180° C. for 2 h to obtain the laminated film; the laminated film was subjected to pore opening, copper plating, and routing. Wherein the method for modifying a polyphenylene ether resin comprises the steps of (1) selection of raw materials: 10 parts of indene oligomer, 100 parts of polyphenylene oxide, 3.3 parts of benzoyl peroxide, and 100 parts of toluene; (2) preparation of indene oligomer-modified polyphenylene ether resin: the indene oligomer, the polyphenylene ether, and the toluene were mixed and heated to be completely dissolved at 100° C. to obtain a mixed solution; benzoyl peroxide was added into the mixed solution in three equal portions and insulated for 6 h. Then, the temperature was lowered to room temperature to give an indene oligomer-modified polyphenylene ether resin.

Example 1 Performance Testing: the test results of the copper interfacial adhesion, flowability, dielectric constant, and dielectric loss of the laminated film are shown in Table 1.

Example 2: a substrate and a surface treatment method thereof, comprising the steps of: (1) selection of raw materials: 60 parts of an indene oligomer-modified polyphenylene ether resin, 160 parts of a spherical silica, 15 parts of a liquid rubber-modified epoxy resin (EPP~175), 25 parts of an active ester curing agent (HPC~8000~65T), 1 part of a silane coupling agent (KBM~403), and 2 parts of a curing accelerator (2E~4MI); (2) preparation of laminated film: the indene oligomer-modified polyphenylene ether resin, spherical silica, liquid rubber-modified epoxy resin, active ester curing agent, silane coupling agent, and curing accelerator were mixed to obtain a laminated film composite; the laminated film composite was applied on a PET base film and dried at 80° C. for 10 min; (3) substrate surface treatment: the laminated film was laminated on the substrate surface, subjected to vacuum hot-pressing at 80° C. for 70 s after the lamination, and then cured at 170° C. for 2.2 h to obtain the laminated film; the laminated film was subjected to pore opening, copper plating, and routing. Wherein the method for modifying a polyphenylene ether resin comprises the steps of (1) selection of raw materials: 5 parts of indene oligomer, 90 parts of polyphenylene oxide, 3.3 parts of benzoyl peroxide, and 100 parts of toluene; (2) preparation of indene oligomer-modified polyphenylene ether resin: the indene oligomer, the polyphenylene ether, and the toluene were mixed and heated to be completely dissolved at 90° C. to obtain a mixed solution; benzoyl peroxide was added into the mixed solution in three equal portions and insulated for 4 h. Then, the temperature was lowered to room temperature to give an indene oligomer-modified polyphenylene ether resin.

Example 2 Performance Testing: the test results of the copper interfacial adhesion, flowability, dielectric constant, and dielectric loss of the laminated film are shown in Table 1.

Example 3: a substrate and a surface treatment method thereof, comprising the steps of: (1) selection of raw materials: 70 parts of an indene oligomer-modified polyphenylene ether resin, 140 parts of a spherical silica, 10 parts of a liquid rubber-modified epoxy resin (EPP~175), 20 parts of an active ester curing agent (HPC~8000~65T), 1 part of a silane coupling agent (KBM~403), and 2 parts of a curing accelerator (2E~4MI); (2) preparation of laminated film: the indene oligomer-modified polyphenylene ether resin, spherical silica, liquid rubber-modified epoxy resin, active ester curing agent, silane coupling agent, and curing accelerator were mixed to obtain a laminated film composite; the laminated film composite was applied on a PET base film and dried at 140° C. for 4 min; (3) substrate surface treatment: the laminated film was laminated on the substrate surface, subjected to vacuum hot-pressing at 100° C. for 50 s after the lamination, and then cured at 190° C. for 1.8 h to obtain the laminated film; the laminated film was subjected to pore opening, copper plating, and routing. Wherein the method for modifying a polyphenylene ether resin comprises the steps of (1) selection of raw materials: 15 parts of indene oligomer, 110 parts of polyphenylene oxide, 3.3 parts of benzoyl peroxide and 100 parts of toluene; (2) preparation of indene oligomer-modified polyphenylene ether resin: the indene oligomer, the polyphenylene ether, and the toluene were mixed and heated to be completely dissolved at 110° C. to obtain a mixed solution; benzoyl peroxide was added into the mixed solution in three equal portions and insulated for 8 h. Then, the temperature was lowered to room temperature to give an indene oligomer-modified polyphenylene ether resin.

Example 3 Performance Testing: the test results of the copper interfacial adhesion, flowability, dielectric constant, and dielectric loss of the laminated film are shown in Table 1.

Example 4: a substrate and a surface treatment method thereof, comprising the steps of: (1) selection of raw materials: 50 parts of an indene oligomer-modified polyphenylene ether resin, 180 parts of a spherical silica, 15 parts of a liquid rubber-modified epoxy resin (EPP~175), 40 parts of an active ester curing agent (HPC~8000~65T), 0.1 part of a silane coupling agent (KBM~403), and 5 parts of a curing accelerator (2E~4MI); (2) preparation of laminated film: the indene oligomer-modified polyphenylene ether resin, spherical silica, liquid rubber-modified epoxy resin, active ester curing agent, silane coupling agent, and curing accelerator were mixed to obtain a laminated film composite; the laminated film composite was applied on a PET base film and dried at 120° C. for 6 min; (3) substrate surface treatment: the laminated film was laminated on the substrate surface, subjected to vacuum hot-pressing at 90° C. for 60s after the lamination, and then cured at 180° C. for 2 h to obtain the laminated film; the laminated film was subjected to pore opening, copper plating, and routing. Wherein the method for modifying a polyphenylene ether resin comprises the steps of (1) selection of raw materials: 10 parts of indene oligomer, 100 parts of polyphenylene oxide, 3.3 parts of benzoyl peroxide, and 100 parts of toluene; (2) preparation of indene oligomer-modified polyphenylene ether resin: the indene oligomer, the polyphenylene ether, and the toluene were mixed and heated to be completely dissolved at 100° C. to obtain a mixed solution; benzoyl peroxide was added into the mixed solution in three equal portions and insulated for 6 h. Then, the temperature was lowered to room temperature to give an indene oligomer-modified polyphenylene ether resin.

Example 4 Performance Testing: the test results of the copper interfacial adhesion, flowability, dielectric constant, and dielectric loss of the laminated film are shown in Table 1.

Example 5: a substrate and a surface treatment method thereof, comprising the steps of: (1) selection of raw materials: 50 parts of an indene oligomer-modified polyphenylene ether resin, 180 parts of a spherical silica, 15 parts of a liquid rubber-modified epoxy resin (EPP~175), 40 parts of an active ester curing agent (HPC~8000~65T), 5 part of a silane coupling agent (KBM~403), and 1 parts of a curing accelerator (2E~4MI); (2) preparation of laminated film: the indene oligomer-modified polyphenylene ether resin, spherical silica, liquid rubber-modified epoxy resin, active ester curing agent, silane coupling agent, and curing accelerator were mixed to obtain a laminated film composite; the laminated film composite was applied on a PET base film and dried at 100° C. for 8 min; (3) substrate surface treatment: the laminated film was laminated on the substrate surface, subjected to vacuum hot-pressing at 90° C. for 60 s after the lamination, and then cured at 180° C. for 2 h to obtain the laminated film; the laminated film was subjected to pore opening, copper plating, and routing. Wherein the method for modifying a polyphenylene ether resin comprises the steps of (1) selection of raw materials: 10 parts of indene oligomer, 100 parts of polyphenylene oxide, 3.3 parts of benzoyl peroxide and 100 parts of toluene; (2) preparation of indene oligomer-modified polyphenylene ether resin: the indene oligomer, the polyphenylene ether, and the toluene were mixed and heated to be completely dissolved at 100° C. to obtain a mixed solution; benzoyl peroxide was added into the mixed solution in three equal portions and insulated for 6 h. Then, the temperature was lowered to room temperature to give an indene oligomer-modified polyphenylene ether resin.

Example 5 Performance Testing: the test results of the copper interfacial adhesion, flowability, dielectric constant, and dielectric loss of the laminated film are shown in Table 1.

Comparative Example 1: the raw materials in Example 1 were changed to 60 parts of polyphenylene ether, 160 parts of spherical silica, 15 parts of liquid rubber-modified epoxy resin (EPP~175), 35 parts of active ester curing agent (HPC~8000~65T), 1 part of silane coupling agent (KBM~403) and 2 parts of curing accelerator (2E~4MI); the rest was the same as in Example 1.

Comparative Example 2: the raw materials in Example 1 were changed to 60 parts of a dicyclopentadiene epoxy resin, 160 parts of spherical silica, 15 parts of a liquid rubber-modified epoxy resin (EPP~175), 35 parts of an active ester curing agent (HPC~8000~65T), 1 part of a silane coupling agent (KBM~403) and 2 parts of a curing accelerator (2E~4MI); the rest was the same as in Example 1.

obtain an indene oligomer-modified polyphenylene ether resin. The modified polyphenylene ether with a smaller molecular weight has a lower softening point and melting point, a better interfacial adhesion, and can be better laminated to a substrate of an integrated circuit. At the same time,

TABLE 1

Table of test results for raw material ratio, copper interfacial adhesion, flowability, dielectric constant, and dielectric loss of laminated film

|  | Ex. 1 | Ex. 2 | Ex. 3 | Ex. 4 | Ex. 5 | Comp. Ex. 1 | Comp. Ex. 2 |
|---|---|---|---|---|---|---|---|
| Indene oligomer-modified polyphenylene ether resin (Mn: 1800) | 50 | 60 | 70 | 50 | 50 | | |
| Polyphenylene oxide (Mn: 1600) | | | | | | 60 | |
| Dicyclopentadiene epoxy resin | | | | | | | 60 |
| EPP~175 | 15 | 15 | 10 | 15 | 15 | 15 | 15 |
| HPC~8000~65T | 35 | 25 | 20 | 40 | 40 | 35 | 35 |
| 2E~4MI | 2 | 2 | 2 | 5 | 1 | 2 | 2 |
| Spherical silica | 180 | 160 | 140 | 180 | 180 | 160 | 160 |
| KBM~403 | 1 | 1 | 1 | 0.1 | 5 | 1 | 1 |
| Performance Test |  |  |  |  |  |  |  |
| Copper interfacial adhesion force/MPa | 15.4 | 15.8 | 16.7 | 15.6 | 16.1 | 8.9 | 9.6 |
| Flowability | ⓒ | ⓒ | ⓒ | ⓒ | ⓒ | X | ⓒ |
| Dielectric Constant@10 GHz | 3.4 | 3.4 | 3.3 | 3.3 | 3.4 | 3.5 | 3.7 |
| Dielectric Loss@10 GHz | 0.0041 | 0.0039 | 0.0039 | 0.0040 | 0.0041 | 0.0044 | 0.0072 |

In Table 1, the copper interfacial adhesion force was tested as follows: the laminated film was respectively spotted on a square area with a size of 3 mm×3 mm on the interface of the test glass, and after curing at 150° C. for 1 hour, the shear bond strength was measured with a universal tensile machine. The test method for flowability included: a square laminated film with the size of 5 mm×5 mm was taken; the laminated film was clamped using a copper sheet and baked for 5 min at 120° C.; the flow distance of the laminated film on the copper sheet was observed. A flow distance of more than 2 mm indicated good flowability, and was denoted as ⓒ; less than 2 mm indicated poor flowability and was denoted by x. Dielectric Constant and Dielectric Loss Testing: 10 GHz, resonant cavity method.

As can be seen from Table 1, the indene oligomer-modified polyphenylene ether resin of Comparative Example 1 has better copper adhesion and flowability than that of Examples under similar Mn conditions. The indene oligomer-modified polyphenylene ether resin of Comparative Example 2, compared to the Examples, has a lower dielectric constant and dielectric loss than the conventional epoxy resin.

In view of the above, the present disclosure provides a method for modifying polyphenylene ether resin, which, when applied to the surface of a substrate, can attach well to the surface of the substrate, reducing the dielectric constant and dielectric loss of the substrate, thereby improving the leakage and heating problems caused when the feature size of an integrated circuit is reduced.

Some embodiments of the present disclosure provide the above technical solutions with the following advantages over the prior art: the present disclosure provides a method for modifying a polyphenylene ether resin. The method modifies the polyphenylene ether with an indene oligomer to reduce the molecular weight of the polyphenylene ether to because it has a lower dielectric constant and dielectric loss, the dielectric constant and dielectric loss of the substrate can be reduced, thereby solving the technical problem of electric leakage and heat generation caused when the existing polyphenylene ether resin is applied to an integrated circuit when the feature size of the integrated circuit is reduced.

The previous description of the disclosed embodiments is provided to enable any person skilled in the art to make or use the present disclosure. Various modifications to these embodiments will be readily apparent to those skilled in the art, and the generic principles defined herein may be implemented in other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method for modifying a polyphenylene ether resin, comprising:
   mixing an indene oligomer, a polyphenylene ether, and a benzene-based organic solvent and then heating and dissolving same to obtain a mixed solution; and
   adding a peroxide initiator to the mixed solution and insulating to obtain an indene oligomer-modified polyphenylene ether resin so as to reduce the molecular weight of the polyphenylene ether.

2. The method for modifying the polyphenylene ether resin of claim 1, wherein the heating comprises a temperature in the range of 90° C.-110° C.; and the insulating comprises an insulation duration of 4 h-8 h.

3. The method for modifying a polyphenylene ether resin of claim 1, wherein the weight ratio of the indene oligomer and the polyphenylene ether is 5-15: 90-110.

4. A laminated film composite comprising an indene oligomer-modified polyphenylene ether resin obtained by the method for modifying the polyphenylene ether resin of claim 1.

5. The laminated film composite of claim 4, further comprising a spherical silica, a liquid rubber-modified epoxy resin, an active ester curing agent, a silane coupling agent, and a curing accelerator.

6. The laminated film composite of claim 5, wherein the weight ratio of the indene oligomer-modified polyphenylene ether resin, the spherical silica, the liquid rubber-modified epoxy resin, the active ester curing agent, the silane coupling agent, and the curing accelerator is 50-70: 140-18: 10-20: 20-40: 0.1-5: 1-5.

7. A laminated film formed from the laminated film composite of claim 4.

* * * * *